(12) United States Patent
Yao et al.

(10) Patent No.: US 8,669,661 B2
(45) Date of Patent: Mar. 11, 2014

(54) METAL LINE AND VIA FORMATION USING HARD MASKS

(75) Inventors: Chih-Hsiang Yao, Taipei (TW); Ying-Wen Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/370,919

(22) Filed: Feb. 10, 2012

(65) Prior Publication Data

US 2013/0207273 A1    Aug. 15, 2013

(51) Int. Cl.
*H01L 23/12* (2006.01)
*H01L 21/4763* (2006.01)

(52) U.S. Cl.
USPC ............ 257/758; 257/E23.194; 257/E21.575; 438/622; 438/926

(58) Field of Classification Search
USPC .......... 257/773, 669, 758, E23.194, E21.575; 438/622, 926
See application file for complete search history.

(56) References Cited

U.S. PATENT DOCUMENTS

| | | | | |
|---|---|---|---|---|
| 6,309,956 | B1* | 10/2001 | Chiang et al. | 438/622 |
| 6,413,847 | B1* | 7/2002 | Yeh et al. | 438/598 |
| 6,717,267 | B1* | 4/2004 | Kunikiyo | 257/758 |

* cited by examiner

*Primary Examiner* — William D Coleman
(74) *Attorney, Agent, or Firm* — Slater & Matsil, L.L.P.

(57) ABSTRACT

A device includes a dielectric layer, a metal line in the dielectric layer, and a via underlying and connected to the metal line. Two dummy metal patterns are adjacent to the metal line, and are aligned to a straight line. A dummy metal line interconnects the two dummy metal patterns. A width of the dummy metal line is smaller than lengths and widths of the two dummy metal patterns, wherein the width is measure in a direction perpendicular to the straight line. Bottoms of the two dummy metal patterns and the dummy metal line are substantially level with a bottom surface of the metal line.

19 Claims, 21 Drawing Sheets

METAL LINE AND VIA FORMATION USING HARD MASKS

BACKGROUND

Integrated circuit devices such as transistors are formed over semiconductor wafers. The integrated circuit devices are interconnected through metal lines and vias to form functional circuits. The metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias, the low-k dielectric material is etched to form trenches and via openings. The etching of the low-k dielectric material may involve forming a metal hard mask over the low-k dielectric material, and using the patterned metal hard mask as an etching mask to form trenches. Via openings are also formed and self-aligned to the trenches. The trenches and the via openings are then filled with a metallic material, which may comprise copper. A chemical Mechanical Polish (CMP) is then performed to remove excess portions of the metallic material over the low-k dielectric material. The remaining portions of the metallic material are the metal lines and vias.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Interconnect structures having metal lines and vias and the methods of forming the same are provided in accordance with various exemplary embodiments. The intermediate stages of forming the interconnect structures are illustrated. The variations of the embodiments are discussed. Throughout the various views and illustrative embodiments, like reference numbers are used to designate like elements.

Figure 1:
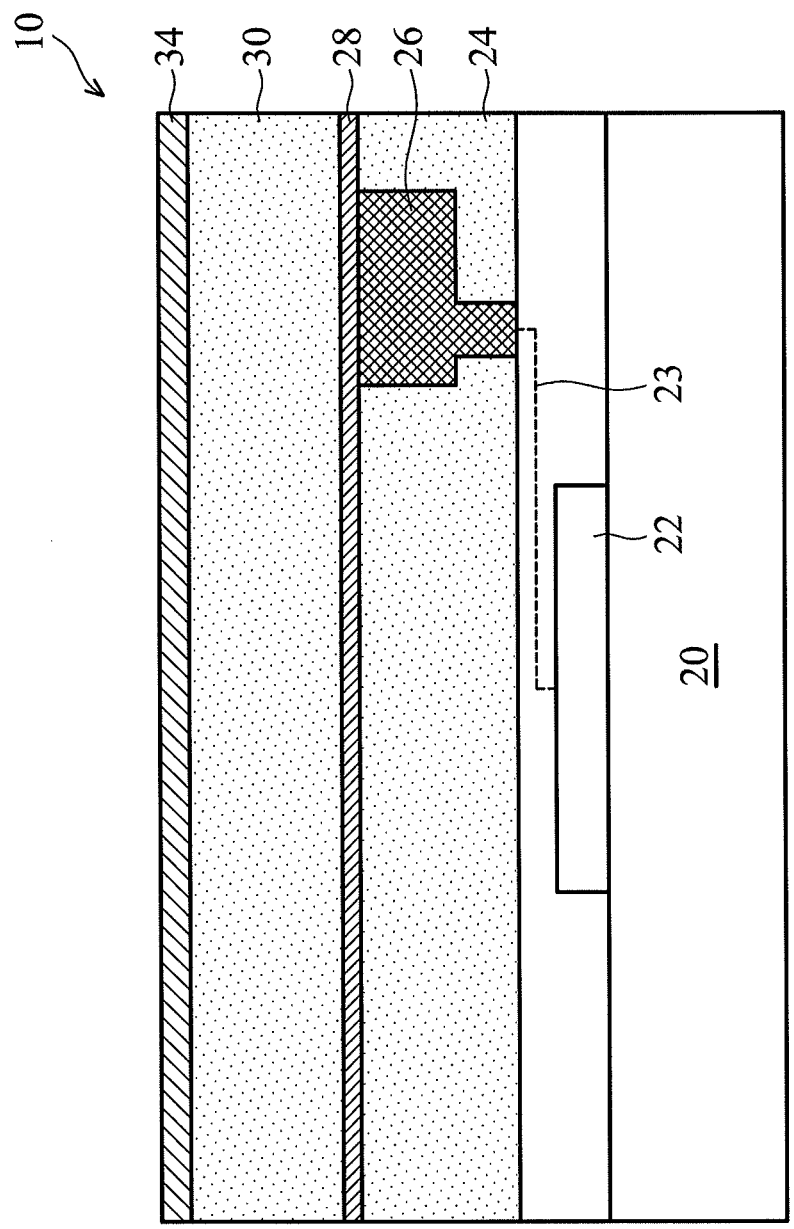
FIGS. 1 through 8 are cross-sectional views of intermediate stages in the formation of interconnect structures in accordance with some exemplary embodiments, wherein the interconnect structures include trenches, vias, dummy patterns, and dummy connections.

Referring to FIG. 1, wafer 10, which includes substrate 20 and the overlying layers, is provided. Substrate 20 may be formed of a commonly used semiconductor material such as silicon, silicon germanium, or the like, and may be a bulk substrate or a semiconductor-on-insulator (SOI) substrate. Integrated circuit devices 22 such as transistors are formed at a surface of substrate 20. Dielectric layer 24 is formed over substrate 20. In some embodiments, dielectric layer 24 is a low-k dielectric layer, for example, having a dielectric constant (k value) lower than about 3.0. Metal feature 26 is formed in dielectric layer 24. In some embodiments, metal feature 26 is formed of copper or a copper alloy. Alternatively, metal feature 26 may be formed of other conductive materials such as tungsten, aluminum, or the like. Metal feature 26 may be electrically coupled to integrated circuit devices 22, wherein the electrical connection is symbolized by line 23.

Etch stop layer 28 is formed over dielectric layer 24 and metal feature 26. Etch stop layer 28 may be formed of silicon carbide, silicon nitride, or the like. Dielectric layer 30 is further formed over etch stop layer 28. Dielectric layer 30 may be formed of a low-k dielectric material that has a k value lower than about 3.0, or lower than about 2.5, for example. Accordingly, throughout the description, dielectric layer 30 is alternatively referred to as low-k dielectric layer 30. Low-k dielectric layer 30 may include a porous or a non-porous low-k dielectric material in some embodiments.

Hard mask 34 is formed over low-k dielectric layer 30. Hard mask 34 may be a metal hard mask formed of metals such as titanium, tantalum, and combinations thereof, or a metal nitride such as titanium nitride, tantalum nitride, boron nitride, and combinations thereof. Accordingly, hard mask 34 is alternatively referred to as metal hard mask 34 hereinafter. In alternative embodiments, hard mask 34 does not comprise metal. Metal hard mask 34 may also be a composite layer, which may include a tantalum layer and a tantalum nitride layer over or underlying the tantalum layer, for example.

Figure 2:
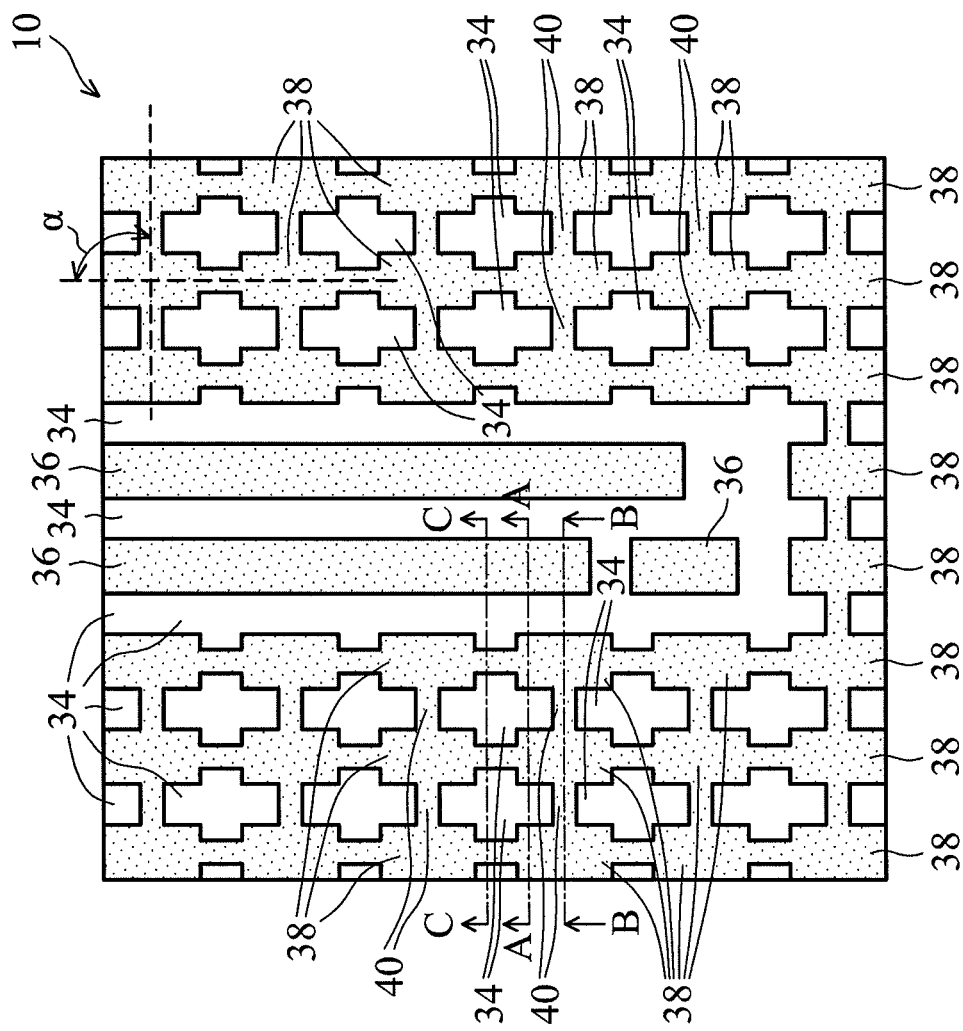

Referring to FIG. 2, which shows a top view, metal hard mask 34 is patterned to form a plurality of openings 36, 38, and 40, which are for forming metal lines, dummy patterns, and dummy connections, respectively. Openings 38 and 40 are disposed to the chip areas that are not occupied by openings 36, so that the patterns of subsequently formed metal features are more uniform. In some embodiments, openings 38 are disposed with a repeated layout, for example, including a plurality of rows and columns. The row direction and the column direction may be perpendicular to each other, and the angle α between the row direction and column direction is equal to 90 degrees. Alternatively, the row direction and the column direction are not perpendicular to each other, and angle α is greater or smaller than 90 degrees. In alternative embodiments, openings 38 are disposed to have other layouts, and the centers of neighboring openings 38, when connected, may form different polygon shapes such rectangles, hexagons, octagons, or the like. Openings 40 may be narrow openings that interconnect neighboring openings 38.

The patterned metal hard mask 34 includes a plurality of portions separated from each other by openings 36, 38, and 40. The top-view shapes of the patterned metal hard mask portions 34 may have various shapes, which may include crosses, for example, although other shapes are also possible, depending on the shapes and the layouts of openings 36, 38, and 40.

Figure 3A:
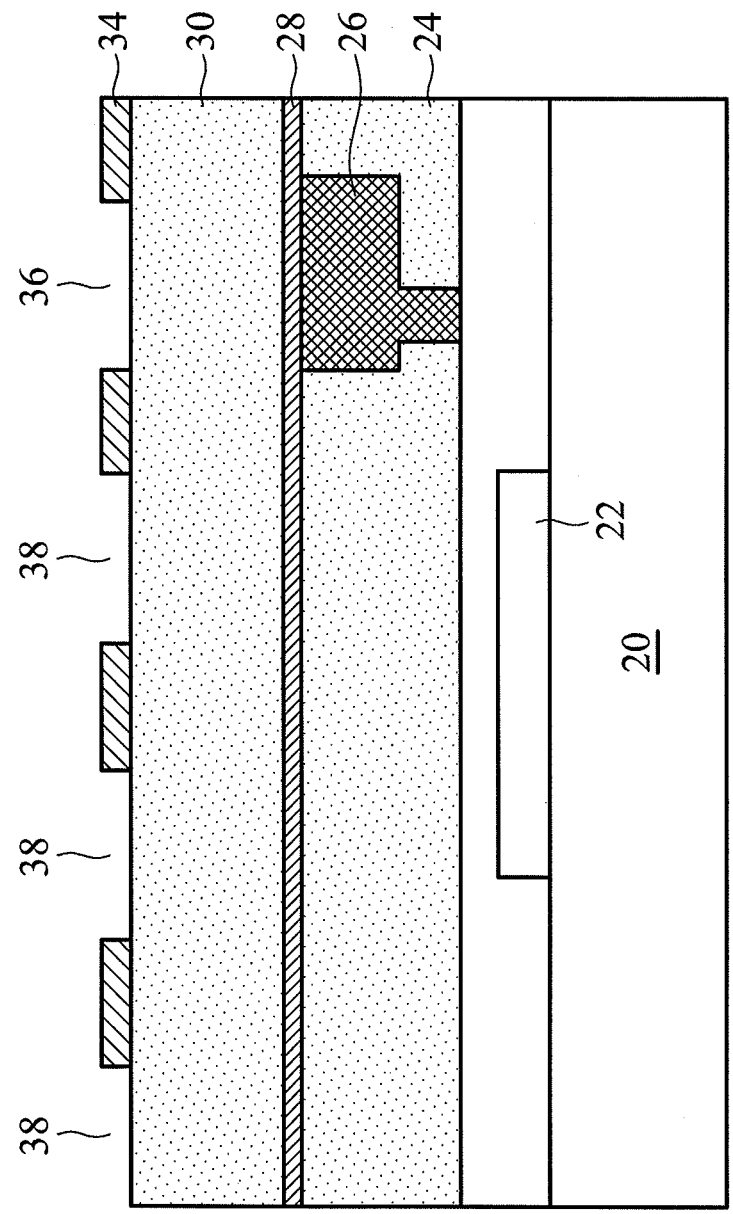
Figure 3B:
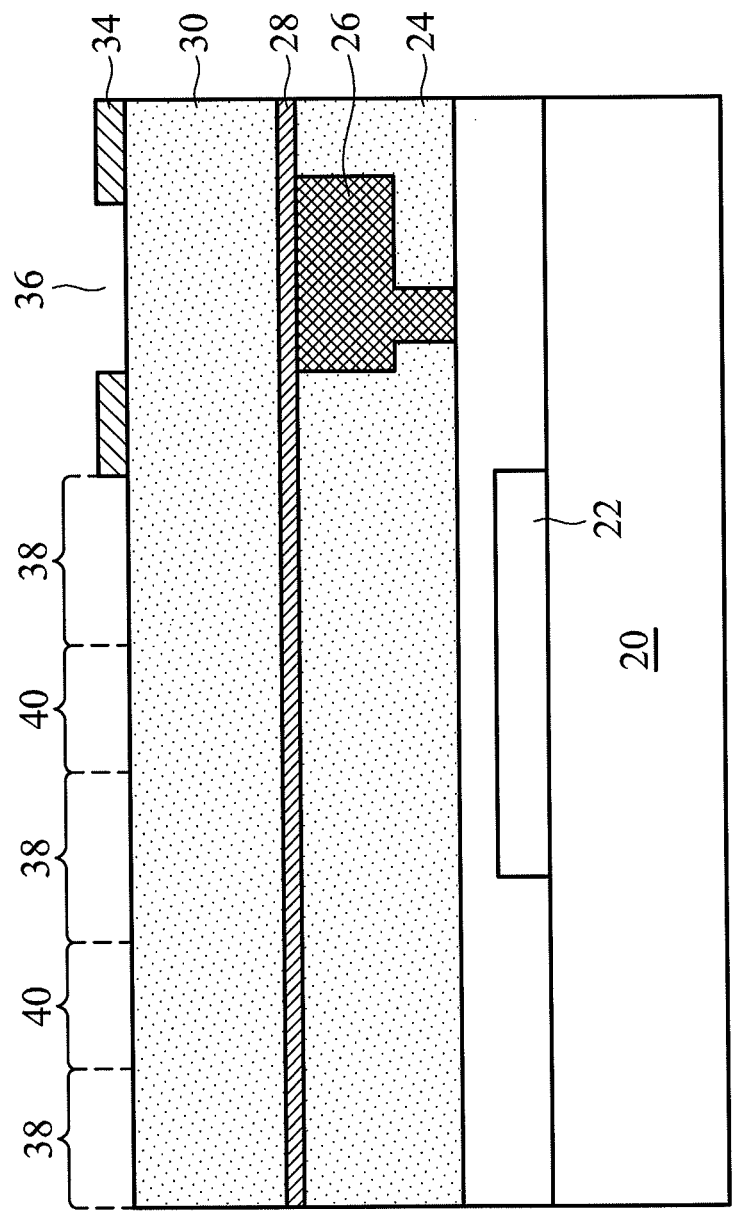
Figure 3C:
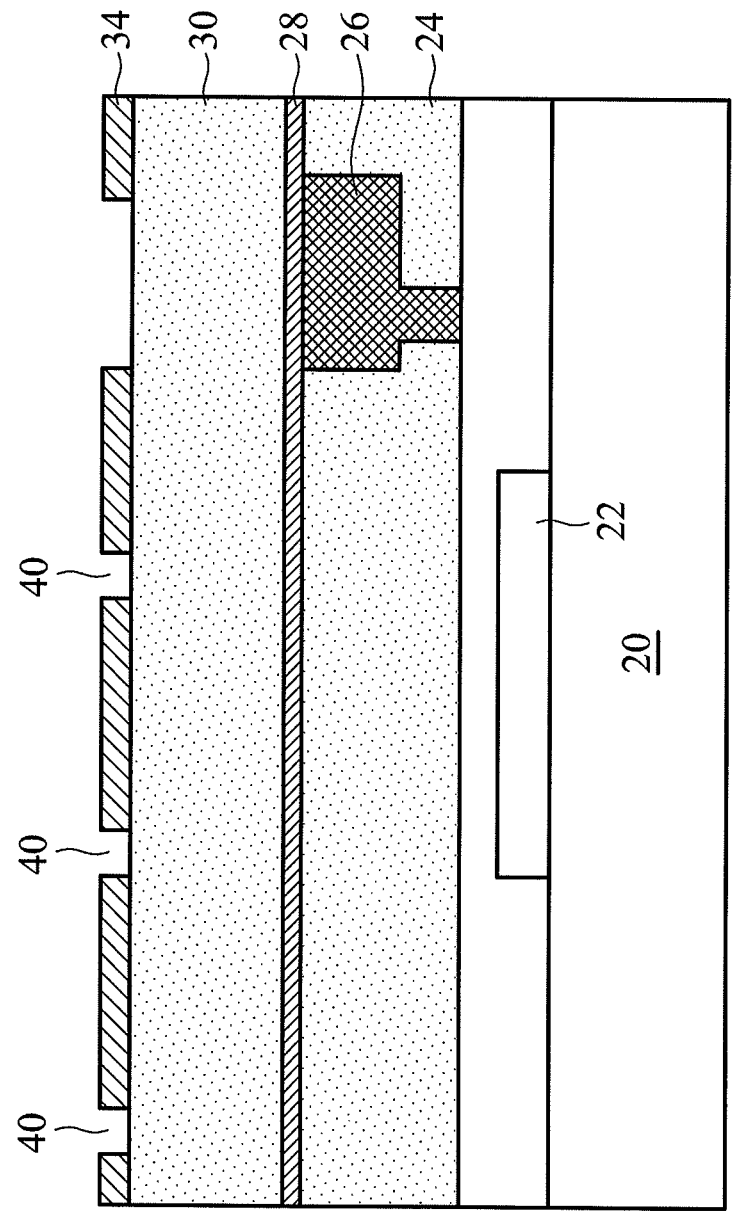

The cross-sectional views of the structure in FIG. 2 are shown in FIGS. 3A, 3B, and 3C, respectively. Throughout the description, each figure number may be followed by a letter "A," "B," or "C." The cross-sectional views in the figures whose figure numbers include the letter A are obtained from the same plane crossing line A-A in FIG. 2. The cross-sectional views in the figures whose figure numbers include the letter B are obtained from the same plane crossing line B-B in FIG. 2. The cross-sectional views in the figures whose figure numbers include the letter C are obtained from the same plane crossing line C-C in FIG. 2. Referring to FIGS. 3A, 3B, and 3C, low-k dielectric layer 30 is exposed through openings 36, 38, and 40 in metal hard mask 34. Opening 36 is over and aligned to metal feature 26. FIG. 3B shows that openings 38 and 40 are connected to form a continuous opening.

Figure 4A:
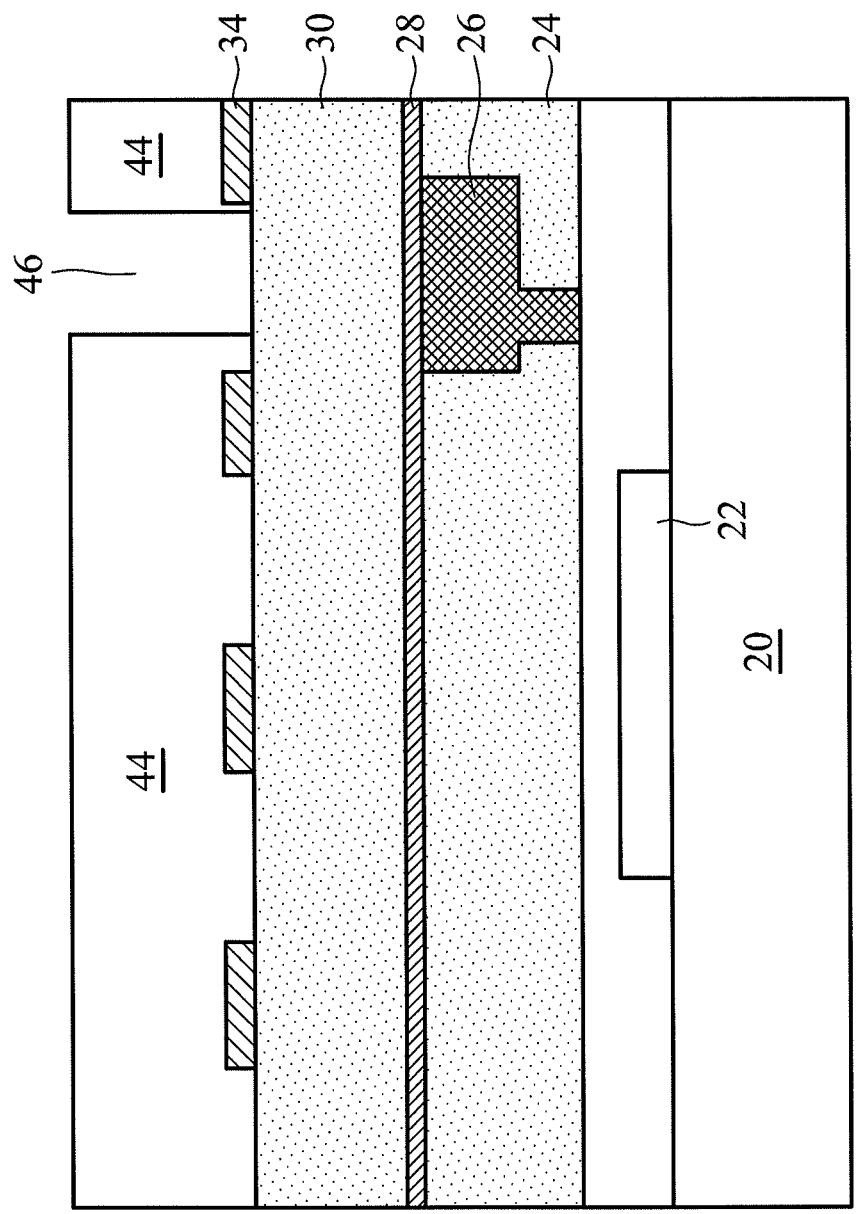
Figure 4B:
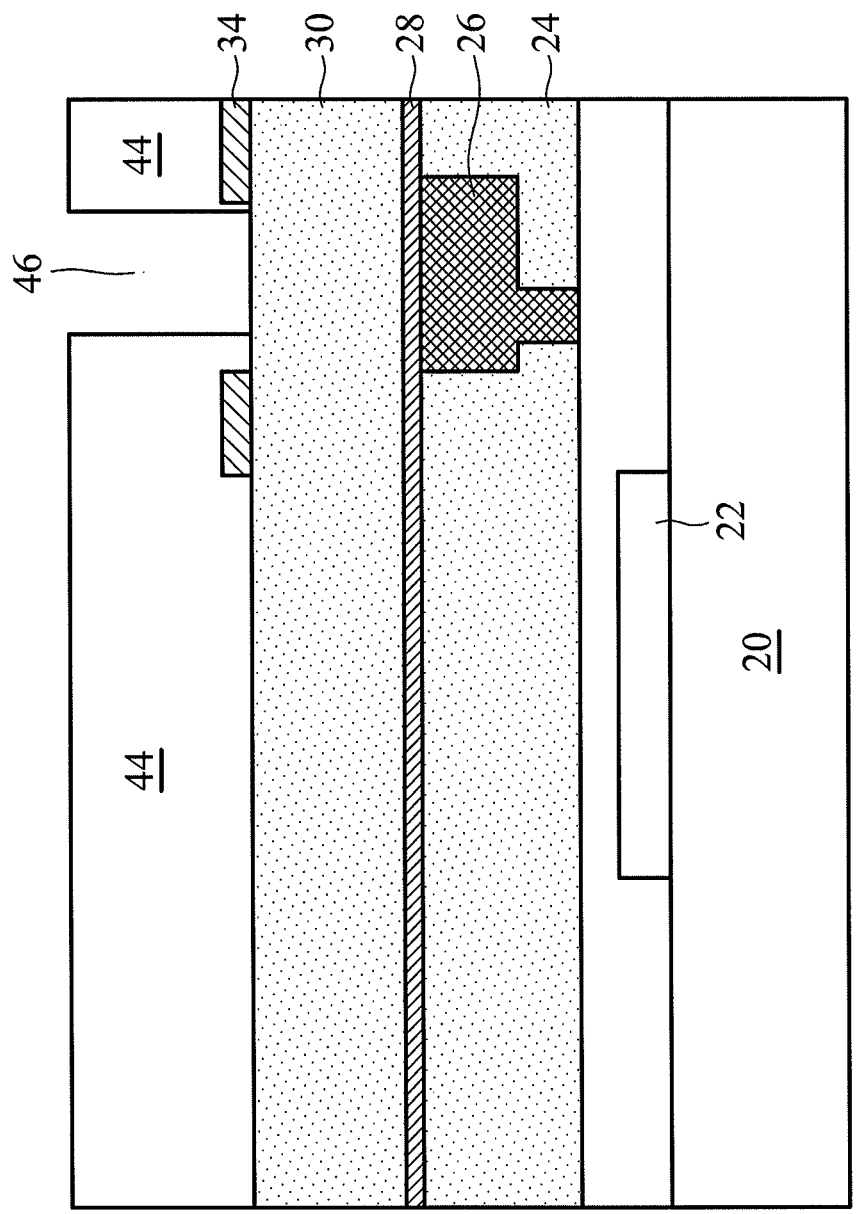
Figure 4C:
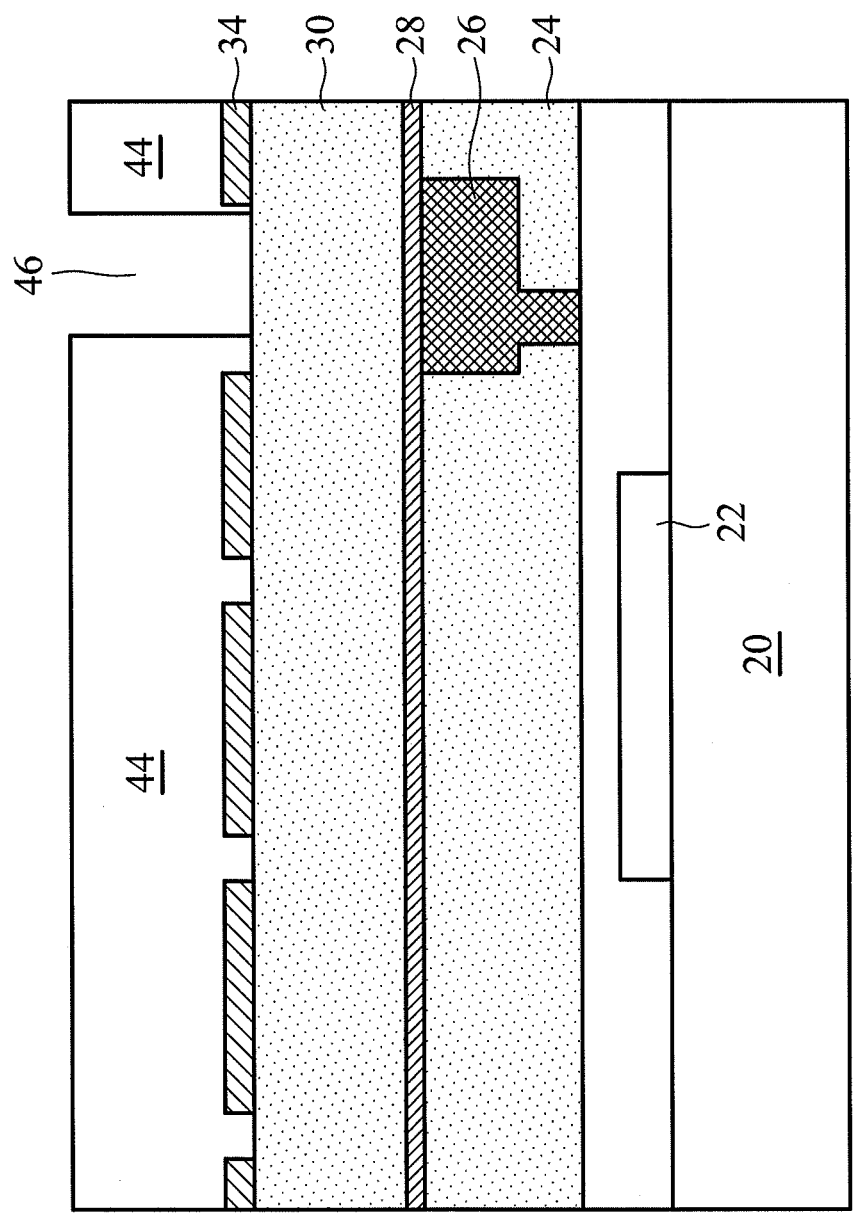
Figure 5A:
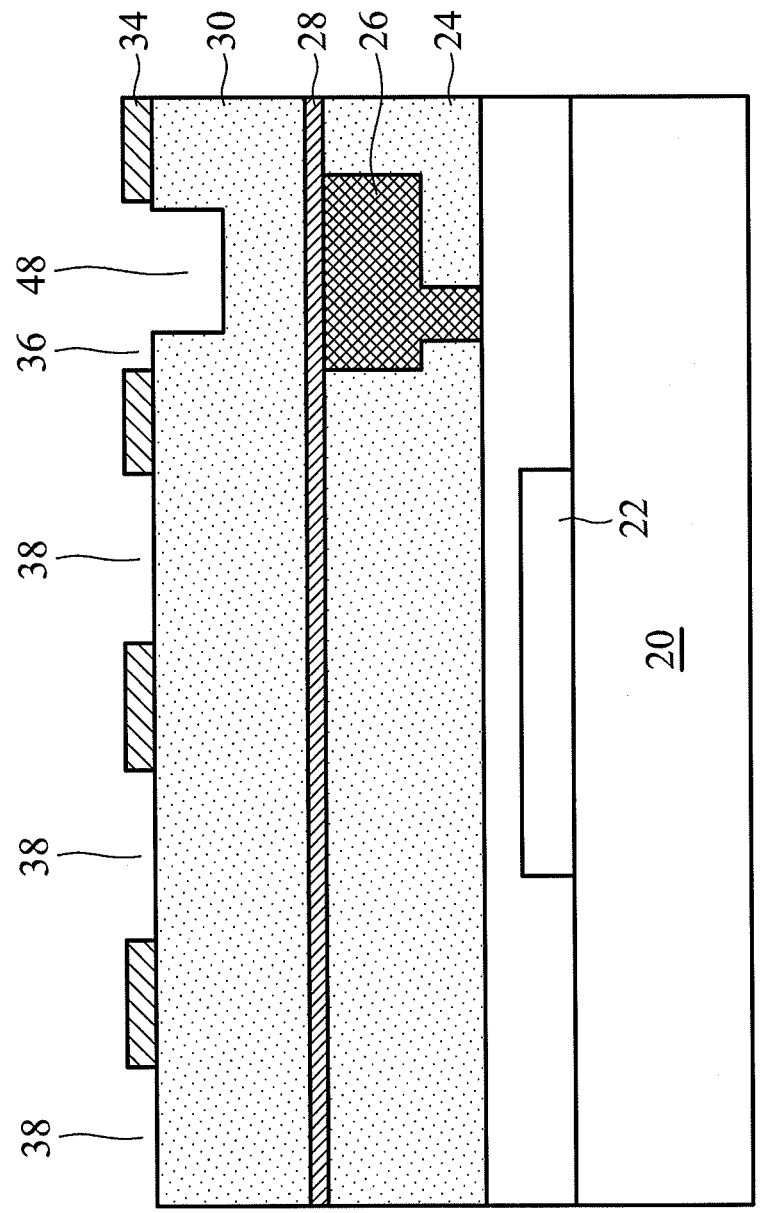
Figure 5B:
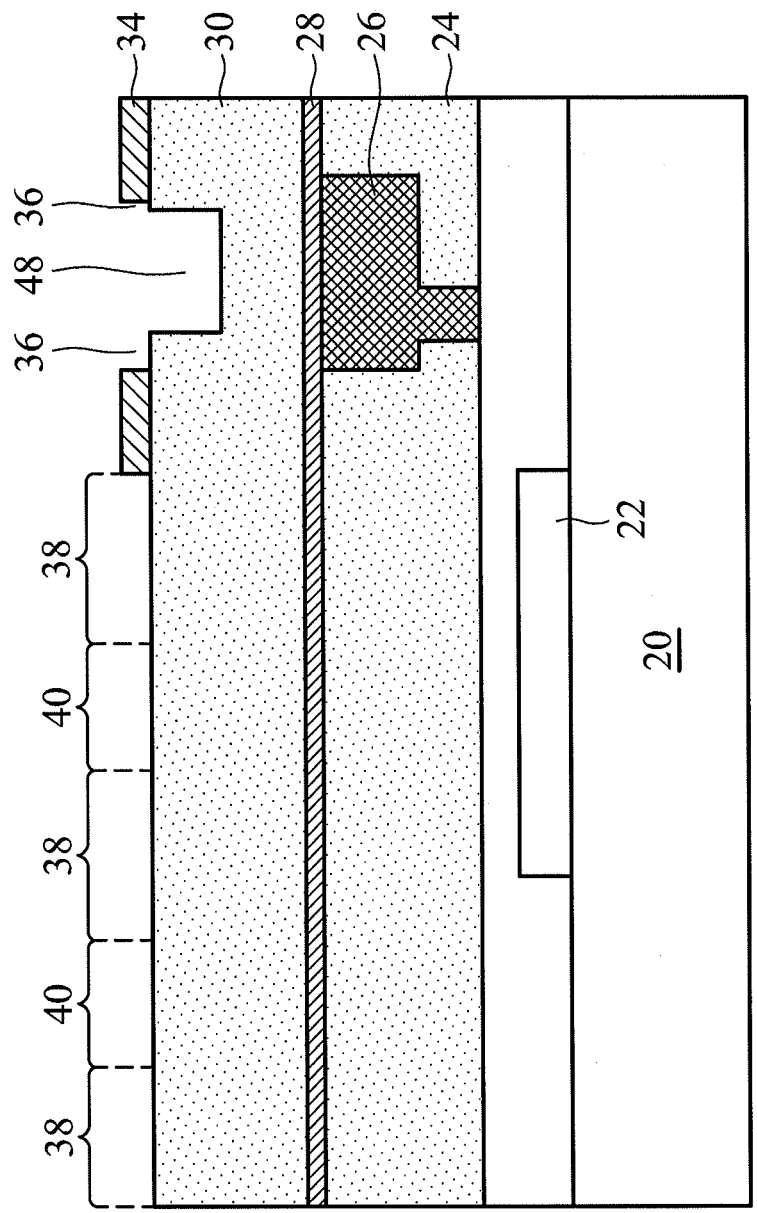
Figure 5C:
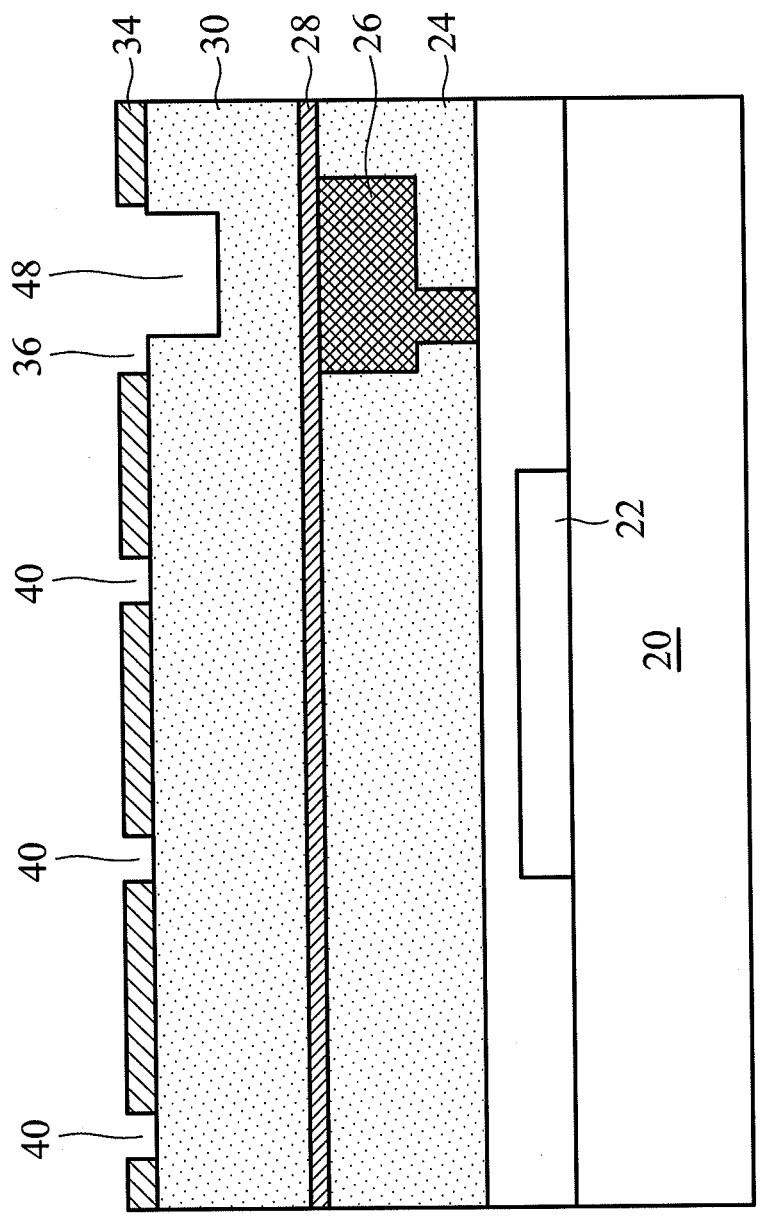

Referring to FIGS. 4A, 4B, and 4C, photo resist 44 is formed over metal hard mask 34 and low-k dielectric layer 30. Photo resist 44 is then patterned to form opening 46 therein, wherein low-k dielectric layer 30 is exposed through opening 46. In some embodiments, photo resist 44 covers all openings 38 and 40 and some portions of opening 36. Next, as shown in FIGS. 5A, 5B, and 5C, photo resist 44 is used as an etching mask to etch low-k dielectric layer 30. Opening 48 is thus formed in low-k dielectric layer 30. In accordance with some embodiments, during the etching of low-k dielectric layer 30, photo resist 44 is also consumed. The thickness of photo resist 44 is selected, so that when the bottom of opening 48 is at an intermediate level (such as the middle level) of low-k dielectric layer 30, photo resist 44 is fully consumed, as shown in FIGS. 5A, 5B, and 5C. As a result, metal hard mask 34 and portions of low-k dielectric layer previously covered by photo resist 44 are exposed.

Figure 6A:
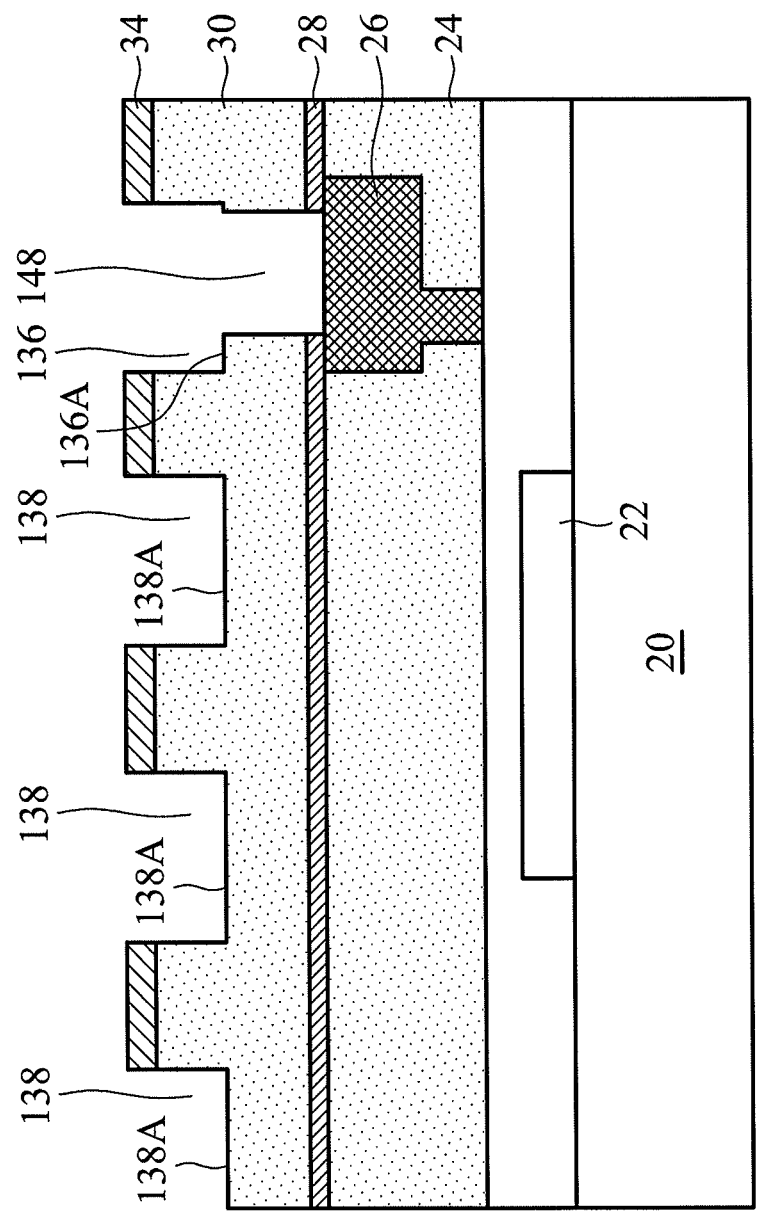
Figure 6B:
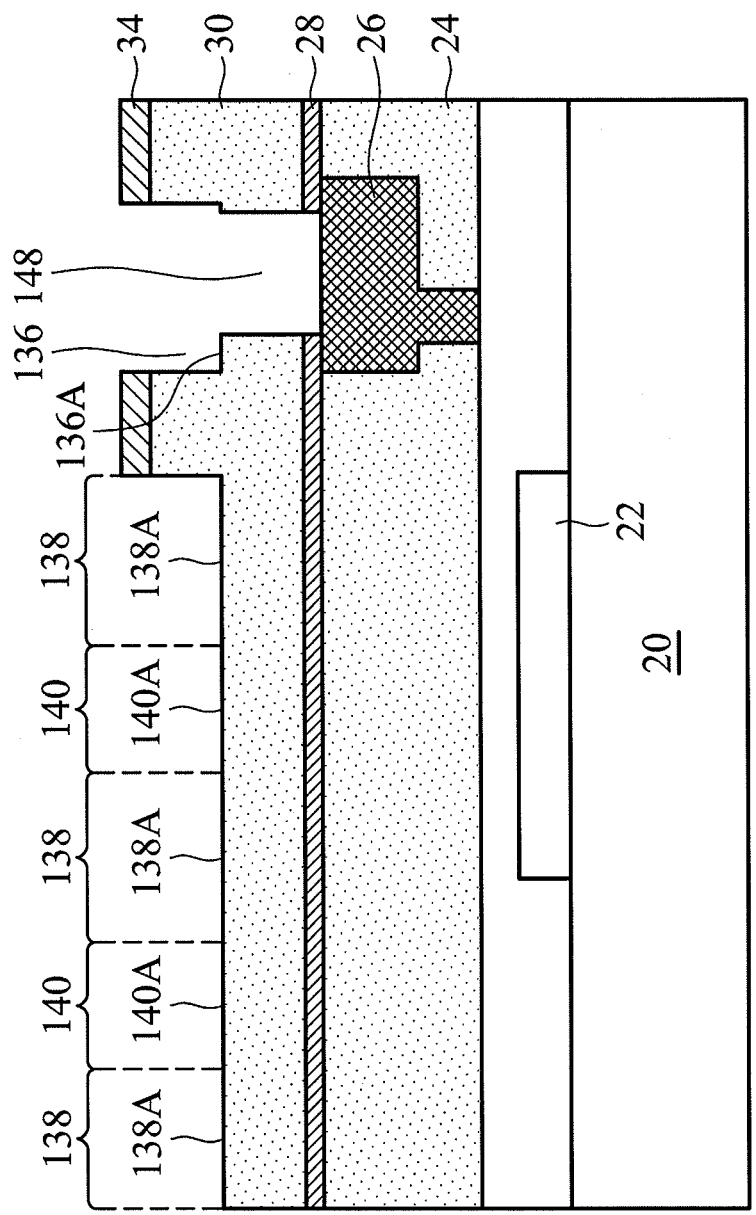
Figure 6C:
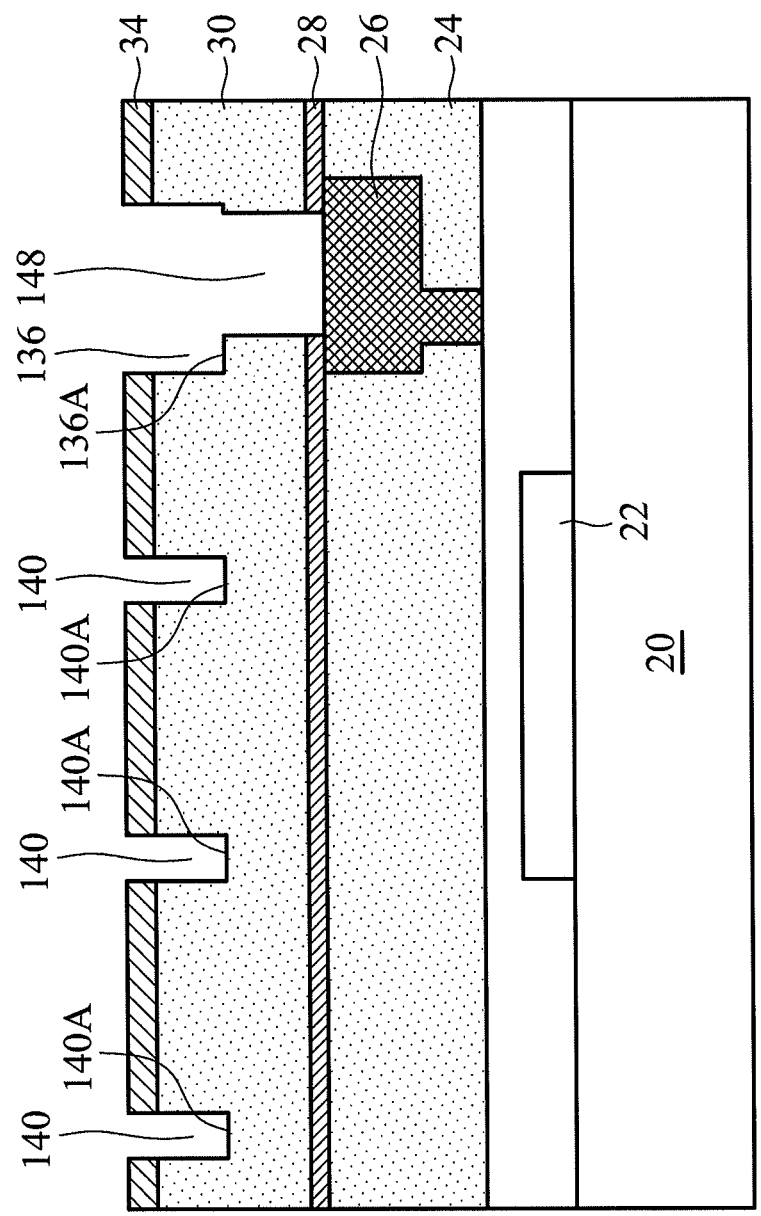

Next, as shown in FIGS. 6A, 6B, and 6C, the exposed metal hard mask 34 is used as an etching mask to further etch low-k dielectric layer 30, for example, using an anisotropic etching method. The portions of low-k dielectric layer 30 exposed through openings 36, 38, and 40 are etched to form trenches 136, 138, and 140, respectively. Trenches 136, 138, and 140 are located in an upper portion of low-k dielectric layer 30, and do not extend to the lower portion of low-k dielectric layer 30. In addition, the portion of low-k dielectric layer 30 below opening 48 (FIGS. 5A, 5B, and 5C) is etched simultaneously when trenches 136, 138, and 140 are formed. Accordingly, via opening 148 is formed in the lower portion of low-k dielectric layer 30. Bottoms surfaces 136A, 138A, and 140A of trenches 136, 138, and 140, respectively, are substantially level with each other. FIG. 6B illustrates that openings 140 interconnect openings 138 to form a continuous opening. The etching of low-k dielectric layer 30 is stopped after etch stop layer 28 is exposed. Next, the exposed portion of etch stop layer 28 is further etched, and the underlying metal feature 26 is exposed.

The etching of low-k dielectric layer 30 may be performed using dry etching, wherein the process gas may include $C_2F_6$, $C_2H_4F_2$, He, and/or the like. The etching may also be performed using the plasma of the process gas. As a result of the dry etch, charges may be accumulated in metal hard mask 34, and cause a voltage difference between metal hard mask 34 and metal feature 26. The amount of accumulated charges is related to the process conditions.

During the etching of low-k dielectric layer 30 and the consumption of photo resist 44 (FIGS. 4A through 4C), undesirable polymer residue (not shown) may be generated and left inside trenches 136, 138, and 140 and/or via opening 148. A wet cleaning may then be performed to remove the polymer residue. In some exemplary embodiments, the wet cleaning is performed using a cleaning solution comprising HF, $NH_4OH$, $NH_3$, or the like. Since the cleaning solution includes ions therein, it is at least partially conductive. As a result, the accumulated charges in metal hard mask 34 may be discharged to metal feature 26 through the ions in the cleaning solution. The discharging of the charges to metal feature 26 causes the corrosion of metal feature 26, and may cause void and/or other defects in metal feature 26.

Referring back to FIG. 2, it is observed that if openings 40 are not formed, metal hard mask 34 form a large interconnected metal hard mask pad. For example, in FIG. 2, all portions of the metal hard mask 34 in the illustrated region of wafer 10 are interconnected. The amount of the charges accumulated in the large metal hard mask pad is thus a great amount. When the great amount of charges are discharged through one or a small number of underlying metal features 26 during the wet cleaning, the damage to the respective metal features 26 is also significant. The formation of openings 40, however, results in the separation of the otherwise large metal hard mask pad into smaller regions. The amount of the charges in each of the small metal hard mask regions is thus small. Accordingly, the damage to the metal feature 26, if any, is reduced.

Figure 7A:
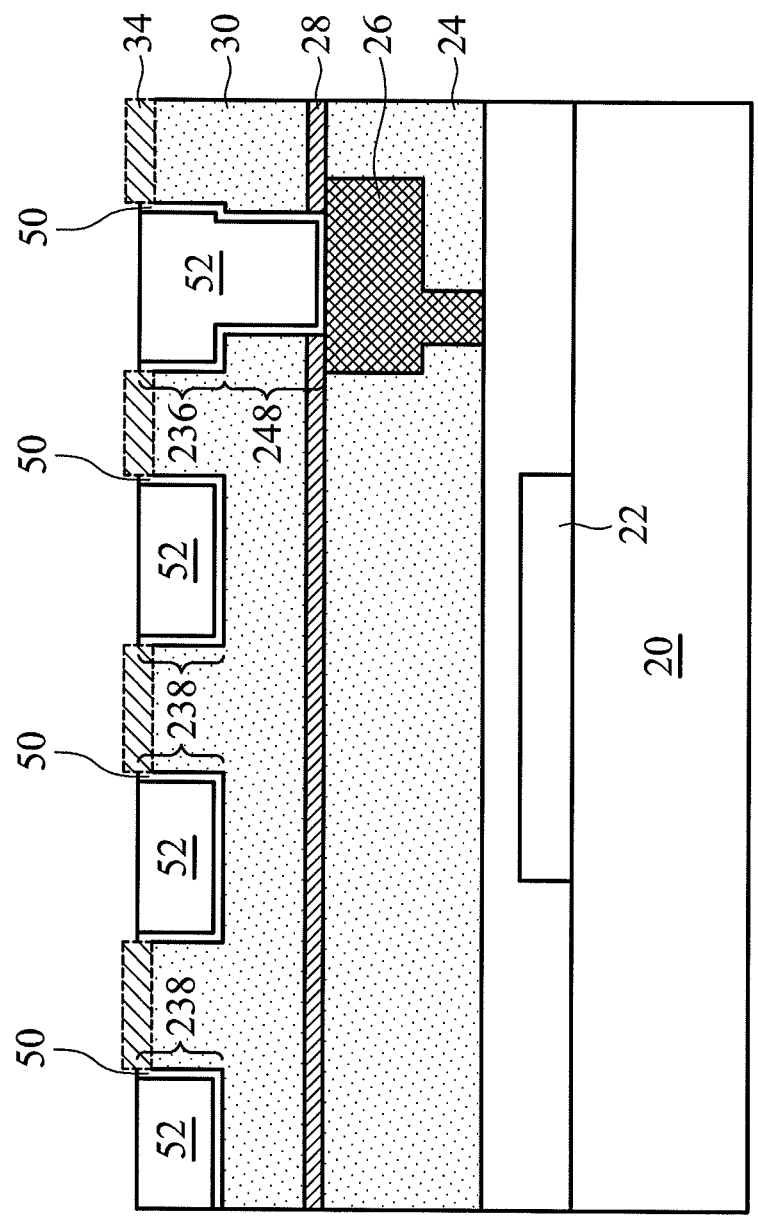
Figure 7B:
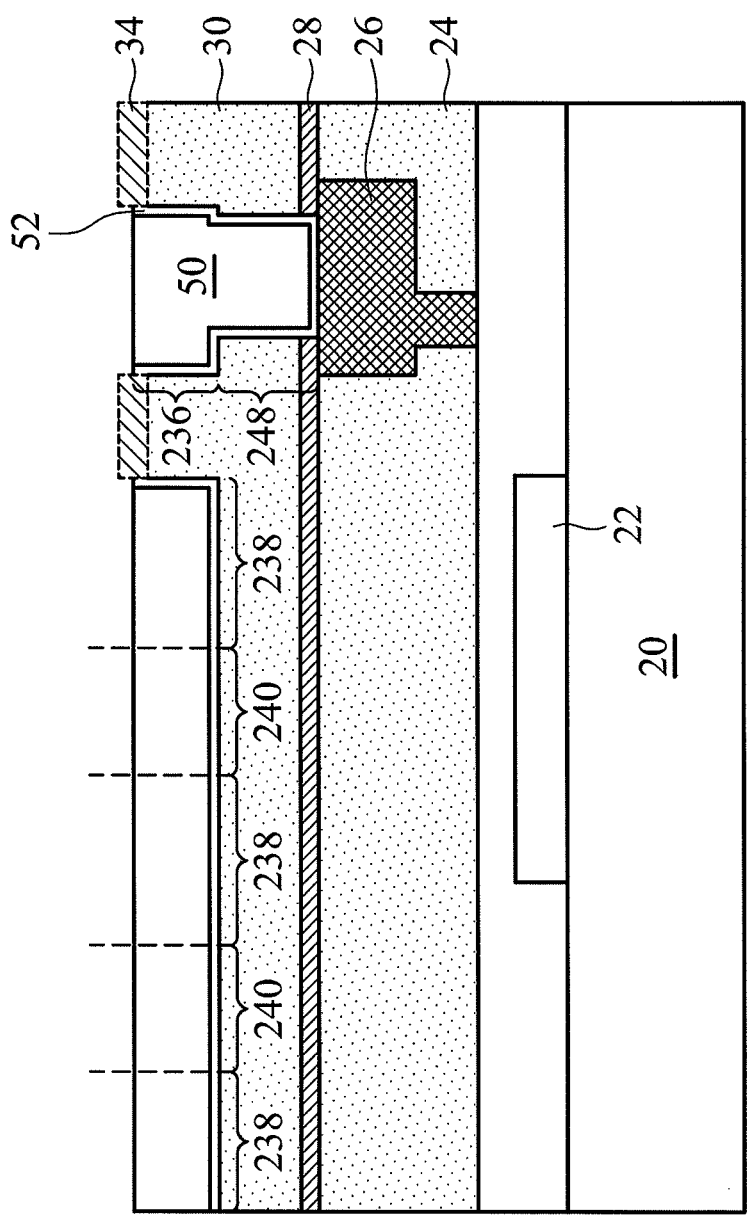
Figure 7C:
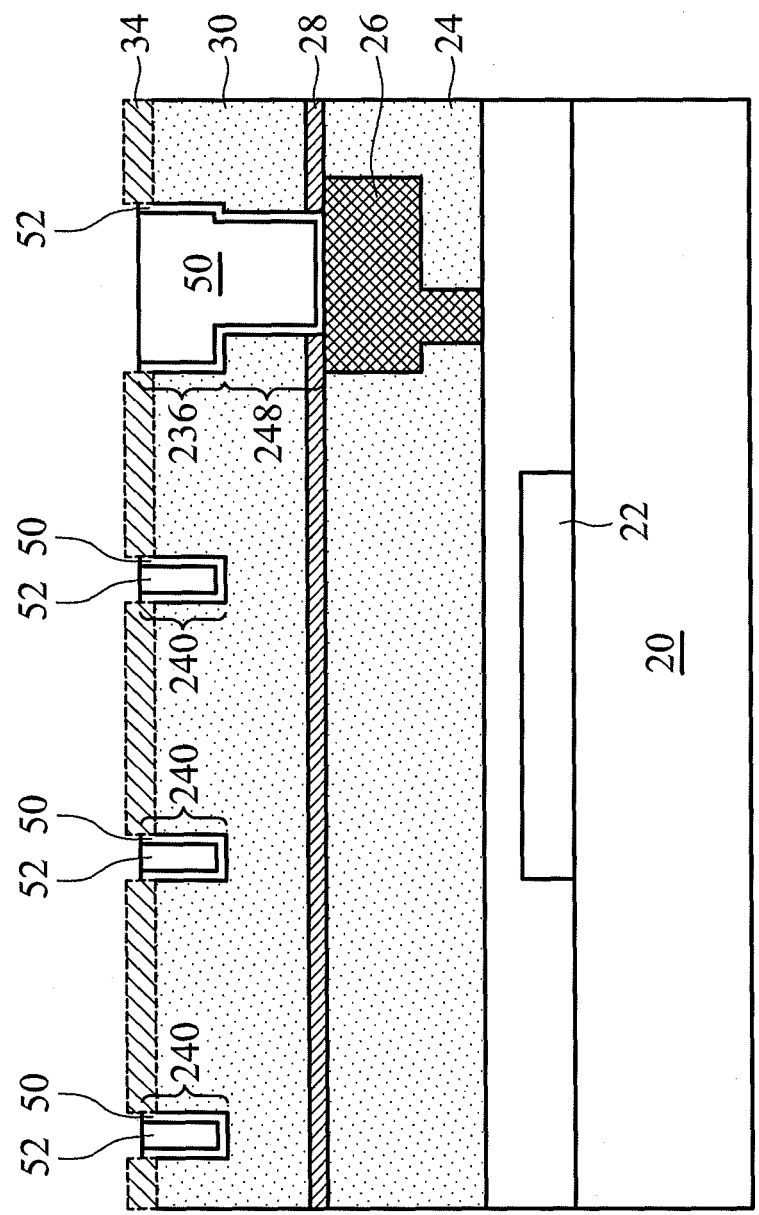

FIGS. 7A, 7B, and 7C illustrate the formation of metal line 236, dummy metal patterns 238, dummy metal connections 240, and via 248, which are formed in trenches 136, 138, 140, and via opening 148 (FIGS. 6A through 6C), respectively. In some embodiments, the formation process include forming diffusion barrier layer 50 as a blanket conformal layer, depositing metallic material 52 over diffusion barrier layer 50, and then performing a Chemical Mechanical Polish (CMP) step to remove the excess portions of metallic material 52 and diffusion barrier layer 50 over metal hard mask 34. The remaining portions of metallic material 52 and diffusion barrier layer 50 thus form metal line 236, dummy metal pattern 238, dummy metal connections 240, and via 248. Metal line 236 and via 248 form a dual damascene structure, wherein no diffusion barrier layer is inserted between metal line 236 and via 248. Metal hard mask 34 may then be removed. In FIGS. 7A through 7C, metal hard mask 34 is illustrated using dashed lines to show that it is removed after the structure in FIGS. 7A through 7C are formed.

In the resulting structure, dummy metal patterns 238 and dummy metal connections 240 are at a same level as metal line 236, which is over via 248. The bottom surfaces of dummy metal patterns 238 and dummy metal connections 240 are substantially level with the bottom surface of metal line 236. In some embodiments, dummy metal patterns 238 and dummy metal connections 240 are not connected to any via, and are electrically floating.

Figure 8:
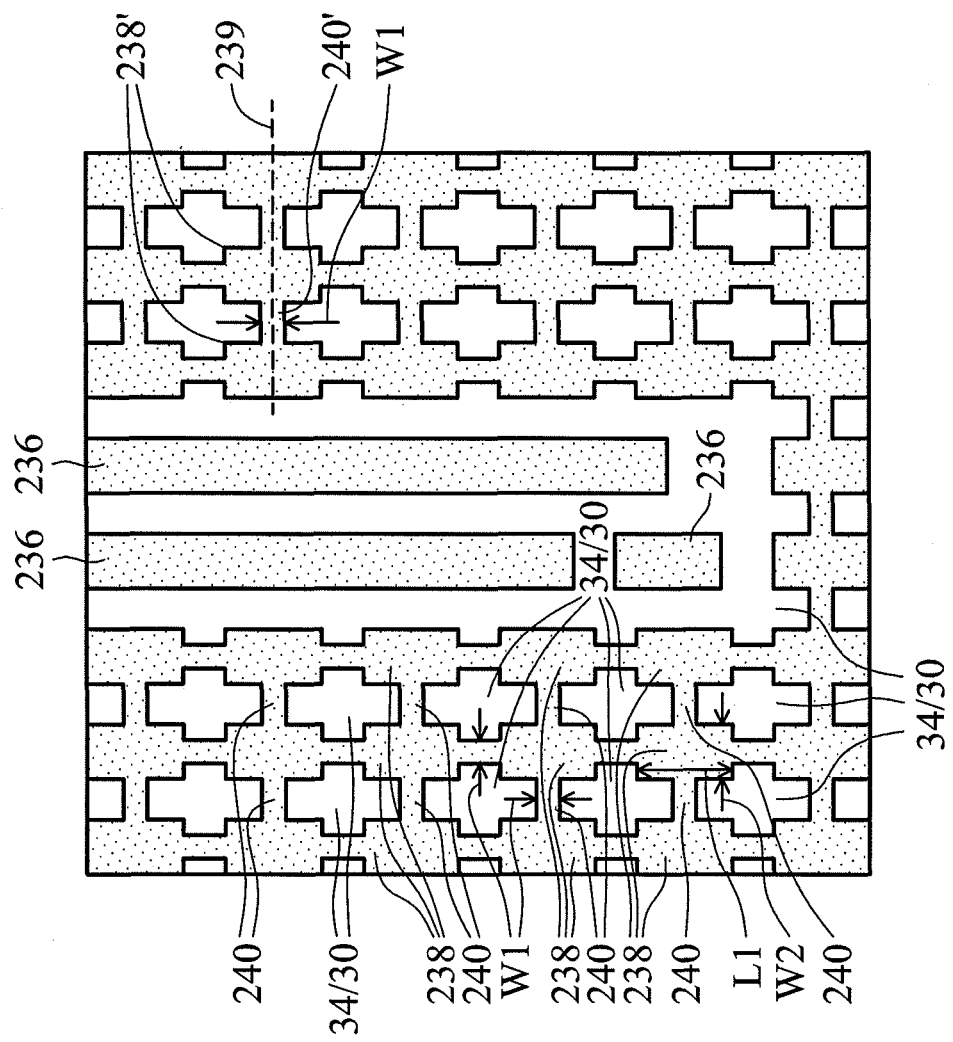

FIG. 8 illustrates a top view of the structures shown in FIGS. 7A, 7B, and 7C. FIG. 8 shows that dummy metal patterns 238 and dummy metal connections 240 may be interconnected, and are disconnected from metal line 236 and via 248. The interconnected dummy metal patterns 238 and dummy metal connections 240 isolate the otherwise large metal hard mask 34 (before its removal) into smaller portions. Furthermore, the interconnected dummy metal pattern 238 and dummy metal connections 240 isolate the upper portion of low-k dielectric layer 30 into smaller portions, which may have the top-view shape of crosses, for example. In some embodiments, widths W1 of dummy metal connections 240 are smaller than about 20 percent, or less than about 10 percent, or 5 percent, of length L1 and width W2 of dummy metal patterns 238. In alternative embodiments, widths W1 of dummy metal connections 240 that interconnect dummy metal patterns 238 in a same row in FIG. 8 are equal to length L1, and widths W1 of dummy metal connections 240 that interconnect dummy metal patterns 238 in a same column in FIG. 8 are equal to width W2. Accordingly, metal patterns 238 and dummy metal connections 240 in combination form dummy metal lines that have uniform widths. In FIG. 8, dummy metal patterns 238' are aligned to straight line 239, and the respective width W1 of the dummy metal connections 240', which interconnect dummy metal patterns 238', is measured in the direction perpendicular to straight line 239. Dummy metal patterns 238 may have various shapes such as rectangles, hexagons, octagons, or the like. Furthermore, the shapes and/or sizes of dummy metal patterns 238 may be identical to each other, or different from each other.

Figure 11:
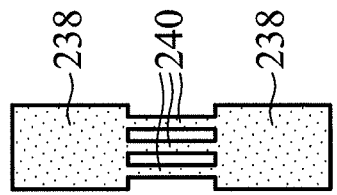
FIGS. 9 through 13 illustrate the top views of trenches, vias, dummy patterns, and dummy connections in accordance with alternative embodiments.
Figure 10:
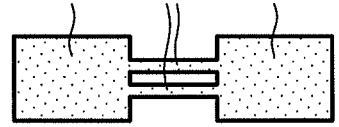
Figure 9:
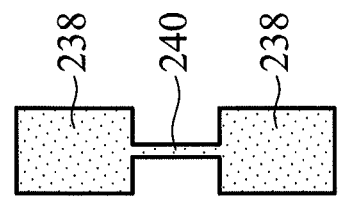

FIGS. 9, 10, and 11 illustrate the top views of exemplary dummy metal patterns 238 and the respective dummy metal connections 240 in accordance with various exemplary embodiments. In FIG. 9, there is a single dummy metal connection 240 interconnecting two neighboring dummy metal patterns 238. FIGS. 9 and 10 illustrate that there may be two or three dummy metal connections 240 interconnecting two neighboring dummy metal patterns 238. In alternative embodiments, two dummy metal patterns 238 may be interconnected through more than three dummy metal connections 240. Dummy metal connections 240 may be narrow straight strips in the top view, as shown in FIGS. 9 through 11. Alternatively, each of dummy metal connections 240 and the respective openings 40 (FIGS. 2 through 3C) may have any other top-view shape (such as curved shapes), as long as openings 40 may electrically decouple two metal hard mask portions 34 on the opposite sides of dummy metal connection 240 from each other.

Figure 12:
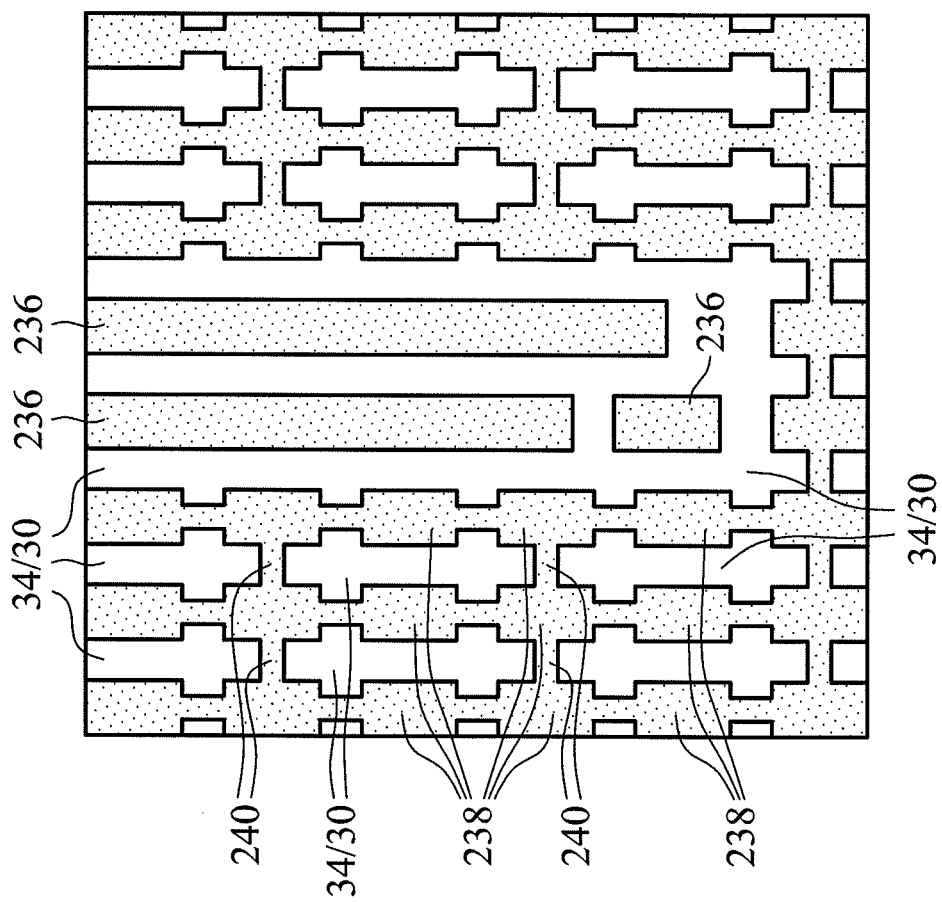
Figure 13:
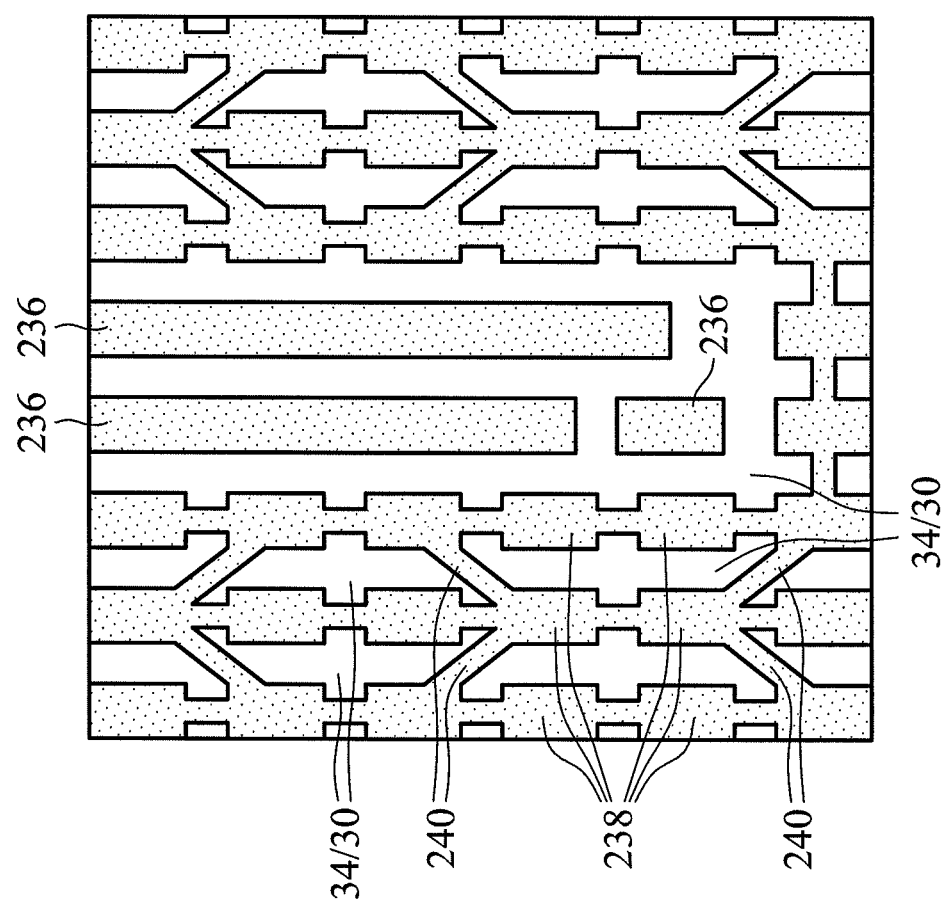

In the embodiments shown in FIG. 8, two neighboring dummy metal patterns 238 in the same row or the same column are interconnected through dummy metal connections 240. Alternatively, some of neighboring dummy metal patterns 238 in the same row or the same column may not be interconnected directly by dummy metal connection 240, as shown in FIG. 12, for example. Some other neighboring dummy metal patterns 238 in the same row or the same column are still interconnected directly by dummy metal connection 240. Using this scheme, the total area of the interconnected metal hard mask patterns 34 may be larger than in the embodiments shown in FIG. 8. The total area of the interconnected metal hard mask 34, however, is still reduced compared to if no openings 40 are formed. FIG. 13 illustrates yet other embodiments, wherein neighboring dummy metal patterns 238 not in the same row or column are interconnected by dummy metal connections 240.

In the embodiments, by isolating large metal hard mask pads into smaller metal hard mask regions, the damage to the underlying metal features may be reduced. The reduction in the damage does not need addition process steps, and does not result in the increase in the manufacturing cost.

In accordance with embodiments, a device includes a dielectric layer, a metal line in the dielectric layer, and a via underlying and connected to the metal line. Two dummy metal patterns are adjacent to the metal line, and are aligned to a straight line. A dummy metal line interconnects the two dummy metal patterns. The width of the dummy metal line is smaller than the lengths and widths of the two dummy metal patterns, wherein the width is measure in a direction perpendicular to the straight line. Bottom surface s of the two dummy metal patterns and the dummy metal line are substantially level with a bottom surface of the metal line.

In accordance with other embodiments, a device includes a semiconductor substrate, a low-k dielectric layer over the semiconductor substrate, and a plurality of dummy metal patterns in an upper portion of the low-k dielectric layer. The plurality of dummy metal patterns is disposed into a layout comprising a plurality of rows and columns. A plurality of dummy metal connections is disposed in the upper portion of the low-k dielectric layer. The neighboring ones of the plurality of dummy metal patterns are interconnected by the plurality of dummy metal connections.

In accordance with yet other embodiments, a method includes forming a dielectric layer over a substrate, forming a hard mask over the dielectric layer, patterning the hard mask, and etching the dielectric layer to form a plurality of openings in the dielectric layer, wherein the hard mask is used as an etching mask. The plurality of openings is filled to form a plurality of dummy metal patterns and a plurality of dummy metal connections. The neighboring ones of dummy metal patterns are interconnected by the plurality of dummy metal connections, which are narrower than the dummy metal patterns.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a dielectric layer;
   a metal line in the dielectric layer;
   a via underlying and connected to the metal line;
   two dummy metal patterns adjacent to the metal line, wherein the two dummy metal patterns are aligned to a straight line; and
   a dummy metal line interconnecting the two dummy metal patterns, wherein a width of the dummy metal line is smaller than lengths and widths of the two dummy metal patterns, wherein the width is measure in a direction perpendicular to the straight line, and wherein bottoms of the two dummy metal patterns and the dummy metal line are substantially level with a bottom surface of the metal line.

2. The device of claim 1 further comprising a plurality of dummy patterns disposed to have a repeated layout, wherein neighboring ones of the plurality of dummy patterns are interconnected by narrow dummy metal lines.

3. The device of claim 1, wherein the two dummy metal patterns have rectangular top-view shapes.

4. The device of claim 1, wherein the metal line and the via form a dual damascene structure, and wherein the two dummy metal patterns and the dummy metal line are not connected to any underlying connecting vias.

5. The device of claim 1 further comprising a metal hard mask over the dielectric layer, wherein the metal hard mask is patterned, and wherein edges of the metal hard mask are aligned to respective edges of the two dummy metal patterns, the dummy metal line, and the metal line.

6. The device of claim 2, wherein the plurality of dummy patterns form an array comprising a plurality of rows and columns, and wherein neighboring ones of the plurality of dummy patterns in a same row are interconnected by narrow dummy metal lines.

7. The device of claim 5, wherein the metal hard mask comprises a compound of nitride and a metal.

8. A device comprising:
   a semiconductor substrate;
   a low-k dielectric layer over the semiconductor substrate;
   a plurality of dummy metal patterns in an upper portion of the low-k dielectric layer, wherein the plurality of dummy metal patterns is disposed into a layout comprising a plurality of rows and columns;
a plurality of dummy metal connections in the upper portion of the low-k dielectric layer, wherein neighboring ones of the plurality of dummy metal patterns are interconnected by the plurality of dummy metal connections; and
a metal hard mask over the low-k dielectric layer, wherein the metal hard mask is patterned, and wherein edges of the metal hard mask are aligned to respective edges of the plurality of dummy metal patterns and the plurality of dummy metal connections.

9. The device of claim 8, wherein each of the plurality of dummy metal connections has a width smaller than lengths and widths of the plurality of dummy metal patterns.

10. The device of claim 8, wherein all neighboring ones of the plurality of dummy metal patterns in a same row are interconnected by the plurality of dummy metal patterns.

11. The device of claim 8 further comprising a dual damascene structure comprising:
a metal line in the upper portion of the low-k dielectric layer, wherein bottom surfaces of the plurality of dummy metal patterns and the plurality of dummy metal connections are substantially level with a bottom surface of the metal line; and
a via in a lower portion of the low-k dielectric layer and connected to the metal line.

12. The device of claim 8, wherein the plurality of dummy metal patterns and the plurality of dummy metal connections are electrically floating.

13. The device of claim 8, wherein portions of the low-k dielectric layer isolated by the plurality of dummy metal patterns and the plurality of dummy metal connections forms low-k dielectric regions having top-view shapes of crosses.

14. A method comprising:
forming a dielectric layer over a substrate;
forming a hard mask over the dielectric layer;
patterning the hard mask;
etching the dielectric layer to form a plurality of openings in the dielectric layer, wherein the hard mask is used as an etching mask; and
filling the plurality of openings to form:
a plurality of dummy metal patterns; and
a plurality of dummy metal connections, wherein neighboring ones of dummy metal patterns are interconnected by the plurality of dummy metal connections.

15. The method of claim 14, wherein the step of etching the dielectric layer comprises a dry etch, and wherein the method further comprises, after the step of etching the dielectric layer and before the step of filling the plurality of openings, performing a wet etch to clean residues in the plurality of openings.

16. The method of claim 14, wherein the hard mask comprises a compound of nitride and a metal.

17. The method of claim 14, wherein the step of etching the dielectric layer comprises:
forming and patterning a photo resist, wherein a portion of the dielectric layer is exposed through an opening in the photo resist;
etching the dielectric layer to form an opening; and
after the photo resist is consumed, continuing etching the dielectric layer to form the plurality of openings, wherein the opening extends down to form a via opening lower than the plurality of openings.

18. The method of claim 14 further comprising, after the step of filling the plurality of openings, removing the hard mask.

19. The method of claim 16, wherein the hard mask comprises titanium nitride.

* * * * *